(12) United States Patent
Blankenship et al.

(10) Patent No.: US 8,356,232 B2
(45) Date of Patent: Jan. 15, 2013

(54) METHOD AND APPARATUS FOR ENCODING AND DECODING DATA

(75) Inventors: Yuei Wu Blankenship, Kildeer, IL (US); T. Keith Blankenship, Kildeer, IL (US); Brian K. Classon, Palatine, IL (US); Ajit Nimbalker, Schaumburg, IL (US)

(73) Assignee: Motorola Mobility LLC, Libertyville, IL (US)

( * ) Notice: Subject to any disclaimer, the term of this patent is extended or adjusted under 35 U.S.C. 154(b) by 1348 days.

(21) Appl. No.: 11/539,404

(22) Filed: Oct. 6, 2006

(65) Prior Publication Data

US 2008/0098273 A1 Apr. 24, 2008

(51) Int. Cl.
*H03M 13/00* (2006.01)

(52) U.S. Cl. ........................................ 714/774; 714/779

(58) Field of Classification Search .................. 714/774, 714/779
See application file for complete search history.

(56) References Cited

U.S. PATENT DOCUMENTS

| | | | |
|---|---|---|---|
| 5,410,308 A * | 4/1995 | Keesen et al. .................... | 341/60 |
| 6,289,486 B1 | 9/2001 | Lee et al. | |
| 6,304,991 B1 | 10/2001 | Rowitch et al. | |
| 6,314,534 B1 | 11/2001 | Agrawal et al. | |
| 6,339,834 B1 | 1/2002 | Crozier et al. | |
| 6,347,385 B1 | 2/2002 | Cui et al. | |
| 6,427,214 B1 | 7/2002 | Li et al. | |
| 6,437,711 B1 | 8/2002 | Nieminen et al. | |
| 6,591,381 B1 | 7/2003 | Kim et al. | |
| 6,625,762 B1 * | 9/2003 | Le Dantec ..................... | 714/701 |
| 6,668,343 B1 | 12/2003 | Kim et al. | |
| 6,766,489 B1 | 7/2004 | Piret et al. | |
| 6,775,800 B2 | 8/2004 | Edmonston et al. | |
| 6,785,859 B2 | 8/2004 | Goldman | |
| 6,854,077 B2 | 2/2005 | Chen et al. | |
| 6,888,901 B2 * | 5/2005 | Yu et al. ......................... | 375/341 |
| 7,170,849 B1 | 1/2007 | Arivoli et al. | |
| 7,200,181 B2 | 4/2007 | Kim et al. | |
| 7,236,480 B2 | 6/2007 | Iancu | |
| 2003/0023909 A1 | 1/2003 | Ikeda et al. | |
| 2006/0120467 A1 | 6/2006 | Miyoshi et al. | |
| 2007/0038912 A1 | 2/2007 | Hashimoto et al. | |
| 2008/0091986 A1 | 4/2008 | Nimbalker et al. | |
| 2008/0098273 A1 * | 4/2008 | Blankenship et al. ......... | 714/746 |
| 2008/0133998 A1 | 6/2008 | Nimbalker et al. | |

(Continued)

FOREIGN PATENT DOCUMENTS

EP 1124344 A1 8/2001

(Continued)

OTHER PUBLICATIONS

3GPP TS 25.212 v6.2.0 (Jun. 2004): "Multiplexing and Channel Coding (FDD) (Release 6)", Jun. 2004.*

(Continued)

*Primary Examiner* — Joseph D Torres

(57) ABSTRACT

A method and apparatus for turbo coding and decoding is provided herein. During operation, a concatenated transport block (CTB) of length X is received and a forward error correction (FEC) block size $K_I$ is determined from a group of available non-contiguous FEC block sizes between $K_{min}$ and $K_{max}$, and wherein $K_{min} \leq K_I < K_{max}$ and wherein $K_I$ is additionally based on X. The concatenated transport block of length X is segmented into C segments each of size substantially equal $K_I$. An FEC codeword for each of the C segments is determined using FEC block size $K_I$, and the C FEC codewords are transmitted over the channel.

11 Claims, 7 Drawing Sheets

U.S. PATENT DOCUMENTS

2011/0197104 A1   8/2011   Nimbalker et al.

FOREIGN PATENT DOCUMENTS

| EP | 1418675 A2 | 5/2004 |
|---|---|---|
| EP | 1850486 A1 | 10/2007 |
| RU | 2265960 C2 | 12/2005 |
| WO | 0035103 | 6/2000 |
| WO | 03105393 A2 | 12/2003 |

OTHER PUBLICATIONS

3GPP TS 25.212 v6.4.0 (Mar. 2005): "Multiplexing and Channel Coding (FDD) (Release 6)", Mar. 2005.*

3GPP TS 25.212 v4.2.0 (Sep. 2001): "Multiplexing and Channel Coding (FDD) (Release 4)", Sep. 2001.*

3GPP TS 25.212 v6.4.0 (Mar. 2005): "Multiplexing and Channel Coding (FDD) (Release 6)", Mar. 2005, Cover page and pp. 10-17.

IEEE Standard 802.16, "Part 16: Air Interface for Fixed Broadband Wireless Access Systems," IEEE, Oct. 1, 2004, Cover page and pp. 587-599.

Berrou C., et al, "Designing Good Permutations for Turbo Codes; Towards a Single Model", in Proceedings of ICC 2004, vol. 1, pp. 341-345, Jun. 2004.

Ericsson, "Quadratic Permutation Polynomial Interleavers for LTE Turbo Coding" 3GPP TSG RAN WG 1 Meeting #47, R1-063137, Nov. 10, 2006, pp. 1-5, XP002473949, Riga, Latvia.

Motorola, "Code Block Segmentation for Contention-Free Turbo Interleavers" R1-063062 of TSG RAN WG 1 Meeting #47, Nov. 10, 2006, pp. 1-4, Riga, Latvia.

Motorola, "Contention-Free Interleaver Designs for LTE Turbo Codes" 3GPP TSG RAN WG 1 Meeting #47BIS, R1-070054, Jan. 19, 2007, pp. 1-9, XP002473951, Sorrento, Italy.

Rosnes, E, et al, "Optimum Distance Quadratic Permutation Polynomial-based Interleavers for Turbo Codes" 2006 IEEE International Symposium on Information Theory, Jul. 9-14, 2006, pp. 1988-1992, XP002473952, Seattle, USA.

Takeshitta Oy "On Maximum Contention-Free Interleavers and Permutation Polynomials Over Integer Rings", IEEE Transactions on Information Theory, Mar. 2006, vol. 52, No. 3, pp. 1249-1253, XP002473953, USA.

PCT Notification of Transmittal of the International Search Report and the Written Opinion of the International Searching Authority, or the Declaration, mailed Jul. 11, 2008, pp. 1-20, PCT/US2007/0834390, European Patent Office.

Motorola, France Telecom, Get Orange, "Eutra FEC Enhancement" 3GPP TSG RAN WG 1 Meeting #44BIS, R1-061050, Mar. 27-31, 2006, pp. 1-14, XP002475873, Athens, Greece.

Motorola, "Eliminating Tail Bits in LTE Channel Coding", R1-062079 of TSG RAN WG 1 Meeting #46, Aug. 28, 2006-Sep. 1, 2006, pp. 1-3, XP002475874, Tallin, Estonia.

Motorola, "A Contention-Free Interleaver Design for LTE Turbo Codes", R1-063061 of 3GPP TSG RAN WG 1, Nov. 6-10, 2006, pp. 1-8, XP002475771, Riga, Latvia.

Blankenship, T. Keith, et al, "High-Throughput Turbo Decoding Techniques for 4G", Proceedings International Conference on Third Generation Wireless and Beyond, May 28, 2002, pp. 137-142, XP009097982.

PCT Notification of Transmittal of the International Search Report and the Written Opinion of the International Searching Authority, or the Declaration, mailed May 20, 2008, pp. 1-15, PCT/US2007/078678, European Patent Office.

"Universal Mobile Telecommunication System, Multiplexing and Channel Coding", 3GPP TS 25.212. version 7.2.0, Release 7, Sep. 2006, vol. 3-R1, No. V720, XP014035549, Sophia-Antipo, France.

Motorola, "Code Block Segmentation for LTE Channel Encoding" 3rd Generation Partnership Project, 3GPP Technical Specification Group, Radio Access network, Working Group1, Feb. 12, 2007, pp. 1-5, XP002434167.

PCT Notification of Transmittal of the International Search Report and the Written Opinion of the International Searching Authority, or the Declaration, mailed May 20, 2008, pp. 1-17, PCT/US2007,078676, European Patent Office.

Rosnes, Eirik et al.: "Improved Algorithms for the Determination of Turbo-Code Weight Distributions", IEEE Transactions on Communications, vol. 53, No. 1, Jan. 2005, pp. 20-26.

Wien Mathias et al.: "Performance Analysis of SVC", IEEE Transactions on Circuits and Systems for Video Technology, Vol. 17, No. 9, September 2007, pp. 1194-1203.

Ryu J et al.: "On quadratic inverses for quadratic permutations polynominals over integer rings", IEEE Transactions on Information Theory, US, vol. 52, No. 3, Mar. 11, 2006, pp. 1254-1260.

Ericsson et al.: "QPP interleaver parameters", 3GPP TSG RAN WG1 #48, R1-071026, St. Louis, USA, Feb. 12-16, 2007, all pages.

* cited by examiner

METHOD AND APPARATUS FOR ENCODING AND DECODING DATA

FIELD OF THE INVENTION

The present invention relates generally to encoding and decoding data and in particular, to a method and apparatus for turbo coding and decoding data.

BACKGROUND OF THE INVENTION

Digital data transmissions over wired and wireless links sometimes may be corrupted, for instance, by noise in the link or channel, by interference from other transmissions, or by other environmental factors. To combat the errors introduced by the channel, many communication systems employ error-correction techniques to aid in communication.

One technique utilized for error correction is turbo coding of an information block to be transmitted. Utilizing such a technique, an encoder within the transmitter of a communication system will encode an input block u of length K bits into a codeword block x of N bits. The codeword block x is then transmitted over the channel, possibly after further processing such as channel interleaving as defined in the IEEE 802.16e specifications. At the receiver, the turbo decoder takes the received signal vector y of length N as input, and generates an estimate û of vector u.

Typically the turbo encoder is composed of two constituent convolutional encoders. The first constituent encoder takes the input block u as input in its original order, and the second constituent encoder takes the input block u in its interleaved order after passing u through a turbo interleaver π. The turbo encoder output x is composed of the systematic bits (equal to the input block u), the parity bits from the first constituent encoder, and the parity bits from the second constituent encoder.

Correspondingly the turbo decoder within the receiver of the communication system is composed of two constituent convolutional decoders, one for each constituent code. The constituent decoders are separated by the interleaver π and the corresponding deinterleaver $\pi^{-1}$. Messages in the format of log-likelihood ratios (LLRs) are passed between the constituent decoders iteratively. The decision û is made after several iterations.

The turbo interleaver π is the key component in the turbo code design. It is responsible for scrambling the input block u in a pseudo-random fashion, thus providing the codewords x with good weight distribution, hence good error-correcting capabilities. In addition to decoding performance, the turbo interleaver π has significant impact on the implementation of the turbo decoder within the receiver. Usually, turbo codes performance improves with increasing interleaver length. However, there is a diminishing return in increasing the interleaver size. In practice, the maximum Forward Error Correction (FEC) block size (i.e., interleaver size) of a turbo code is limited to a certain value due to complexity and delay reasons. Hence, if the size of the input block (concatenated transport block or CTB) is larger than the maximum FEC block size supported by the turbo code, the CTB is segmented (e.g., using code block segmentation rule) into several small segments, each of which is processed separately by the turbo encoder at the transmitter and correspondingly by the turbo decoder at the receiver.

In some systems, the turbo code may be designed to support only a small number of FEC block sizes for various reasons (e.g., high speed decoding, reduced storage, etc).

Therefore, a need exists for a method and apparatus for turbo coding and decoding that appropriately matches the CTB to available FEC block sizes.

DETAILED DESCRIPTION OF THE DRAWINGS

Figure 1:
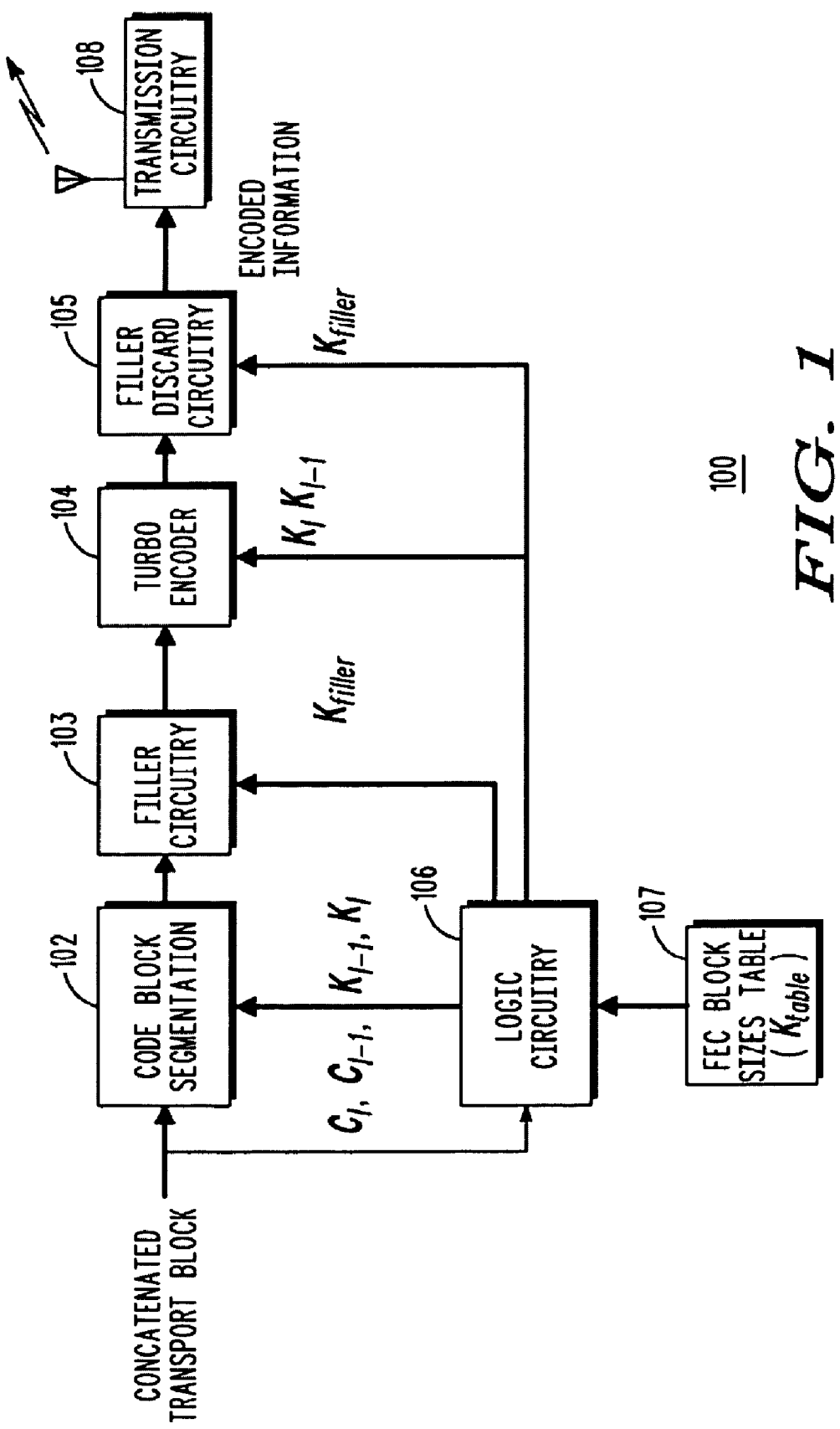
FIG. 1 is a block diagram of a transmitter.

In order to address the above-mentioned need, a method and apparatus for turbo coding and decoding is provided herein. During operation, a concatenated transport block (CTB) of length X is received and a forward error correction (FEC) block size $K_I$ is determined from a group of available non-contiguous FEC block sizes between $K_{min}$ and $K_{max}$, and wherein $K_{min} \leq K_I < K_{max}$ and wherein $K_I$ is additionally based on X. The concatenated transport block of length X is segmented into C segments each of size substantially equal to $K_I$. An FEC codeword for each of the C segments is determined using FEC block size $K_I$; and the C FEC codewords are transmitted over the channel.

In an alternate embodiment, a concatenated transport block (CTB) of length X is received and two FEC block sizes $K_{I-1}$ and $K_I$ are determined from a group of non-contiguous FEC block sizes, wherein the available non-contiguous FEC block sizes are between $K_{min}$ and $K_{max}$, and wherein $K_{min} \leq K_{I-1} < K_{max}$, $K_{min} \leq K_I \leq K_{max}$, and wherein $K_{I-1}$ and $K_I$ are additionally based on X. The concatenated transport block of length X is segmented into C segments each of size substantially equal to $K_{I-1}$ or $K_I$. An FEC codeword for each of the C segments is determined using FEC block sizes $K_I$ or $K_{I-1}$, and the C FEC codewords are transmitted over the channel.

The benefit of the above methods is that they reduce the padding of filler bits required to encode the CTB, while using the fewest number of segments allowed by the available non-contiguous FEC block sizes. In particular, the second method uses two different (but adjacent) FEC block sizes to minimize the number of filler bits while using the fewest number of segments as allowed by the available non-contiguous FEC block sizes. Moreover, the FEC block sizes for the segment sizes and the number of segments for the two embodiments may be determined using simple logic circuitry.

Prior to describing encoding and decoding data, the following definitions are provided to set the necessary background:

For ease of notation, a concatenated transport block refers to the result of concatenating one or more transport blocks, after adding overhead such as CRC bits to each transport block.

X denotes the concatenated transport block size (e.g., length of the concatenated transport block in bits).

Y denotes the total number of filler bits added to a concatenated transport block.

C denotes the number of segments a concatenated transport block gets segmented into.

CBSS$_i$ denotes the size of the i$^{th}$ segment of a concatenated transport block (i=1, . . . C, where C is the segment size. CBSS stands for code block segment size.

K$_{I-1}$ and K$_I$ denote FEC block sizes (e.g., sizes for which turbo code internal interleaver are defined) that may be used to FEC encode the segments of a concatenated transport block.

K$_{table}$ denotes a set of available non-contiguous FEC block sizes (sizes for which a turbo code internal interleaver is defined).

K$_{filler}$ denotes the number of filler bits added to a segment.

R denotes the mother code rate of the turbo coder (e.g., R=⅓ for the 3GPP Turbo Code).

R$^{-1}$ is the inverse of mother code rate of turbo coder (e.g., R$^{-1}$=3 for the 3GPP Turbo Code).

N$_{tb}$ is the number of tail bits in the FEC codeword at the output of FEC encoder. In particular, N$_{tb}$=12 for 3GPP turbo code with tail bits.

N$_{tb}$=0 for a 3GPP turbo code with tail-biting.

π denotes the turbo code internal interleaver.

The flooring operation ⌊x⌋ denotes the largest integer smaller than or equal to x and the ceiling operation ⌈x⌉ denotes the smallest integer larger than or equal to x.

Turning now to the drawings, wherein like numerals designate like components, FIG. 1 is a block diagram of transmitter 100. As shown, transmitter 100 comprises code block segmentation circuitry 102, filler circuitry 103, turbo encoder 104, filler discard circuitry 105, transmitter 108, logic circuitry 106, and table/storage 107. Transmitter 100 additionally comprises of receiving circuitry (not shown in FIG. 1) that receives a concatenated transport block of length X. Logic circuitry 106 determines an available FEC block size K$_I$ from a group of non-contiguous FEC block sizes 107, wherein the available non-contiguous FEC block sizes are between K$_{min}$ and K$_{max}$, and wherein K$_{min}$≤K$_I$<K$_{max}$, and wherein K$_I$ is additionally based on X. Code block segmentation circuitry 102 segments the concatenated transport block of length X into C segments of sizes substantially equal to K$_I$; and encoding circuitry 104 determines an FEC codeword for each of the C segments using FEC block size K$_I$. Finally transmission circuitry 108 transmits the C FEC codewords over a channel.

In another embodiment, the transmitter 100 comprises receiving circuitry (not shown in the FIG. 1) that receives a concatenated transport block of length X, logic circuitry 106 that determines two available FEC block sizes K$_{I-1}$ and K$_I$ from a group of non-contiguous FEC block sizes 107, wherein the available non-contiguous FEC block sizes are between K$_{min}$ and K$_{max}$, and wherein K$_{min}$≤K$_{I-1}$<K$_{max}$, K$_{min}$≤K$_I$≤K$_{max}$, and wherein K$_{I-1}$ and K$_I$ are additionally based on X. Transmitter 100 comprises code block segmentation circuitry 102 that segments the concatenated transport block of length X into C segments of sizes substantially equal to K$_{I-1}$ or K$_I$, and encoding circuitry 104 that determines an FEC codeword for each of the C segments using FEC block size K$_I$ or K$_{I-1}$. Finally transmission circuitry 108 is provided that transmits the C FEC codewords over a channel.

Encoding circuitry 104 is preceded by filler circuitry 103 that inserts filler bits into the segments to form an FEC input block. FEC encoder 104 encodes the FEC input block, and filler discard circuitry 105 discards bits related to the filler bits.

During operation of transmitter 100, data in the form of a concatenated transport block is received by circuitry 102. Circuitry 102 prepares the concatenated transport block before Forward Error Correction (FEC) encoding.

In general, the range of the CTB sizes (i.e., X) may be different from the range of the FEC block sizes supported by the underlying FEC scheme in the physical layer for a communication system. Therefore, it is necessary to define a rule that divides a CTB into segments that can be efficiently handled by the FEC. In particular, CTB sizes (i.e., X) are often much larger than the maximum FEC block size that FEC encoder 104 can handle. Therefore, the CTB needs to be segmented by circuitry 102 into a number of smaller-sized segments and each segment needs to be encoded by FEC encoder 104 into a separate FEC codeword.

Circuitry 102 uses a code block segmentation rule that is designed to achieve good performance (i.e., the aggregate performance of the segments for a given CTB) with the underlying FEC. It involves the following aspects for any given CTB size:

Choosing the number of segments C;

Choosing the sizes of each segment;

Inserting the filler bits before FEC encoding and the removing of filler bits after FEC encoding, if the segment size cannot be handled directly by the FEC.

The proposed segmentation rules are particularly useful for Evolved-UMTS Terrestrial Radio Access (EUTRA) system where a turbo coder may be defined for only a limited set of FEC block sizes (interleaver sizes). Unlike the Release 6 3GPP Turbo coder that defines 5075 interleavers of contiguous sizes, one for each interleaver size K$_I$ between 40 bits and 5114 bits, an EUTRA turbo coder may define a limited number of FEC block sizes K$_{table}$ (e.g., 40-50 interleavers with non-contiguous sizes ranging from 128 bits to 6144 bits) to cover a large number of segment sizes (e.g., 6144-128+1=6017 sizes). When the segment size is equal to an available FEC block size, then the segment can be taken as an FEC input block directly (thus no need of filler bit insertion). However, when the segment size is not equal to any available FEC block sizes, filler bit padding may be applied, and the next larger available FEC block size (i.e., interleaver size) chosen from K$_{table}$ 107 may be used.

Number of Segments:

The segmentation rules take the following properties of turbo coding into account.

(a) Turbo code performance improves as the FEC block size increases.

(b) Turbo code performance improvement via increasing FEC block sizes has diminishing returns beyond a few thousand bits.

(c) A CTB is received correctly only if all the segments are received correctly.

Properties (a) and (c) indicate that the overall performance is likely to be dominated by the segment having the worst performance. Thus, it is preferable to have segments that are approximately of equal sizes so that they are FEC encoded with approximately equal FEC block sizes (and hence accorded approximately equal error protection from FEC perspective).

Property (b) suggests that it is not necessary to include interleavers for very large sizes in the table (K$_{table}$). However, the FEC block sizes defined in K$_{table}$ may depend on other factors. For example, i) for reduced storage/complexity, a small number of interleavers in K$_{table}$ may be desirable, and ii) the maximum interleaver size defined in K$_{table}$ may be chosen to limit the number of segments per CTB, thus limiting the segmentation penalty of a CTB. The segmentation penalty is the performance loss due to dividing a CTB into several segments instead of encoding the entire CTB into one FEC codeword.

Property (c) suggests that the minimum number of segments should be used to reduce segmentation penalty.

Considering all the above, the number of segments is $C=\lceil X/K_{max}\rceil$, where $K_{max}$ is the maximum FEC block size defined in $K_{table}$. Assuming that $CBSS_i$ denote the segment size of the $i^{th}$ segment (i=1, ... of the concatenated transport block, the sum of all segments is equal to the concatenated transport block size X, i.e., the segment sizes are constrained by the following equation.

$$\sum_{i=1}^{C} CBSS_i = X$$

The next section describes the determination of the FEC block size used for FEC encoding, one for each of the C segment size.

FEC Block Size Determination

Given that a CTB of length X is the input to the code block segmentation function, the rule for determining the FEC block size (interleaver size) for turbo coder as described in Release 6 of the 3GPP standard is as follows $$C=\lceil X/K_{max}\rceil,$$

$$K_I=\max(40,\lceil X/C\rceil), \quad (1)$$

$$Y=CK_I-X.$$

where $K_{max}$=5114 is the maximum interleaver size for Rel 6 Turbo code, C is the number of segments (or code blocks), $K_I$ is the interleaver size, and Y is the total number of filler bits inserted for the CTB of size X when C FEC input blocks of size $K_I$ is used. In essence, a CTB of size X is segmented into C segments of approximately equal size, and each segment is encoded using a turbo code with a $K_I$-bit interleaver. If Y>0, Y known bits are padded to the beginning of the first segment before encoding. Since the FEC block sizes (i.e., interleavers) are defined for all sizes between $K_{min}$=40 and $K_{max}$=5114 in Release 6 3GPP turbo code, the number of filler bits is bounded by C, the number of segments used for code block segmentation.

However, in other systems such as the one being considered for EUTRA, the FEC block sizes (interleaver sizes) may be defined only for non-contiguous sizes (a coarser set of interleaver sizes) $K_{table}$. In such cases, segment sizes that are not equal to any available FEC block sizes (i.e., not defined in $K_{table}$) need to be handled using filler bits before FEC encoding (and puncturing after encoding to arrive at a desired code rate).

Assuming that a turbo coder supports only a limited number of FEC block sizes distributed between $K_{min}$ and $K_{max}$, both inclusive, two simple methods of code block segmentation of a concatenated transport block of length X using $K_{table}$ are described next. These methods use as few segments as possible while they also reduce the number of filler bits that are required for encoding, Allow One FEC Block Size Only One method is to modify (1) and let all segments be encoded with a single interleaver size $K_I$, where $$I = \arg\min_{K_i \geq \lceil X/C\rceil} (K_i - \lceil X/C\rceil), \quad (2)$$

where i, $1\leq i\leq T$, indexes into the group of non-contiguous FEC block sizes available in $K_{table}$, assuming the T sizes in $K_{table}$ are sorted in ascending order. In essence, this method chooses the smallest $K_I$ from $K_{table}$ that is greater than or equal to $\lceil X/C\rceil$, i.e., $K_I=\lceil X/C\rceil+\delta$, where $0\leq\delta<K_I-K_{I-1}$, and $K_{I-1}<\lceil X/C\rceil$. Note that it is assigned that $K_{I-1}$=0 when I=1. Therefore, the number of filler bits is given by $$Y = CK_I - X \qquad (3)$$
$$= C(\lceil X/C\rceil + \delta) - X,$$

Therefore, Y is large when $\delta$ is large. The following examples illustrate how the number of available FEC block sizes ($K_{table}$) affects Y.

- If $K_{table}$ has all the values between $Z_{min}$=40 and $Z_{max}$=5114, the maximum number of filler bits is equal to C−1.
- If $K_{table}$ has T=100 values uniformly distributed between $Z_{min}$=40 and $Z_{max}$=5114, the maximum total number of filler bits padded to all segments is approximately equal to 50×C.

Therefore, the number of filler bits can be controlled by varying the FEC block size granularity in $K_{table}$. The number of filler bits can also be reduced using another approach as described next. However, before discussing the next method, it is noted that in a general case, any $K_I(\geq\lceil X/C\rceil)$ can be chosen from $K_{table}$ for FEC encoding at the cost of potentially increased number of filler bits. In this case, the segment sizes obtained after code block segmentation satisfy $CBSS_i\leq K_I$, for i=1, ... C. In this case, logic circuitry 106 determines the number of segments using the following relation $$C=\lceil X/K_{max}\rceil,$$

Allow Two Adjacent FEC Block Sizes Only

Instead of using one FEC block size $K_I$ for encoding all the segments of a given CTB, it is proposed that two adjacent FEC block sizes $K_{I-1}$ and $K_I$, $K_{I-1}<K_I$, $1\leq I\leq T$, be selected from $K_{table}$. Note that it is assigned that $K_{I-1}$=0 when I=1. The number of segments C and the larger FEC block size $K_I$ are still chosen to be the same as in earlier cases, i.e., C is still computed as in (1) and $K_I$ is still computed as in (2). However, the number of segments encoded with size $K_{I-1}$ and size $K_I$ are determined as follows (for easy understanding, all involved computations are repeated below). In this case, logic circuitry 106 performs the following operations to find the number of segments, $$C=\lceil X/K_{max}\rceil=C_I+C_{I-1},$$

$$Y=CK_I-X,$$

$$D_I=K_I-K_{I-1},$$

$$C_{I-1}=\lfloor Y/D_I\rfloor,$$

$$C_I=C-\lfloor Y/D_I\rfloor, \qquad (4)$$

and $C_{I-1}$ and $C_I$ are the number of segments that are encoded using FEC block sizes $K_{I-1}$ and $K_I$, respectively, where $K_I$ is the smallest size from available FEC block sizes that is greater than or equal to $\lceil X/C\rceil$, and $D_I$ denotes the difference between the adjacent interleaver sizes $K_{I-1}$ and $K_I$.

Note that in (4) Y does not indicate the number of filler bits required if allowing two adjacent sizes; but indicates the number of filler bits required had only one size of $K_I$ is used for all C segments.

Thus, the code block segmentation forms C segments, of which $C_{I-1}$ segments are FEC-encoded with a FEC block size $K_{I-1}$. Note that when Y<$D_I$, (4) gives $C_{I-1}$=0, and this method degenerates to using one FEC block size of $K_I$, (i.e., $K_{I-1}$ size is allowed but not actually used.) On the other hand, when Y≧$D_I$, this method requires fewer filler bits than padding all C segments to the larger FEC block size $K_I$. This method is optimal in that the number of filler bits Y" added per CTB is guaranteed to be least while using the fewest segments as possible. Y" is determined as follows $$Y''=C_{I-1}K_{I-1}+C_I K_I-X, \quad (5)$$

It can be proven that Y" is bounded by $D_I$, regardless of C, $$0 \leq Y'' < K_I - K_{I-1}, \quad (6)$$

In this case, the segment sizes obtained after code block segmentation have the following constraints, assuming (without loss of generality that the first $C_I$ segments are encoded with $K_I$ and rest with $K_{I-1}$).

$$CBSS_i \leq K_I, \text{ for } i=1, \ldots C_I$$

$$CBSS_i \leq K_{I-1}, \text{ for } i=C_I+1, \ldots C; \text{ if } C_{I-1} \geq 1.$$

Returning to FIG. 1, as discussed above, a proper FEC block size needs to be chosen from table 107 of non-contiguous FEC block sizes. Logic circuitry 106 performs the task of choosing the appropriate FEC block size/sizes as discussed above. An example of table 107 is given in Table 1. For example, in first case, logic circuitry 106 chooses FEC block size from the available non-contiguous FEC block sizes between $K_{min}$ and $K_{max}$, and wherein $K_{min} \leq K_I \leq K_{max}$, and wherein $K_I$ is additionally based on X. Particularly, if a single FEC block size $K_I$ is to be used, logic circuitry 106 chooses the smallest $K_I$ (from $K_{table}$) that is not smaller than ⌈X/C⌉, i.e., $K_I$=⌈X/C⌉+δ, where δ≧0, and $K_{I-1}$<⌈X/C⌉. If, however, two FEC block sizes are to be used, $K_{I-1}$ and $K_I$ are determined with equation (4) giving the number of segments that are encoded using FEC block sizes $K_{I-1}$ and $K_I$.

TABLE 1

The set of FEC block sizes for which turbo coder internal interleaver is defined.

| $K_{table}$ | | | | | |
|---|---|---|---|---|---|
| 128 | 256 | 512 | 1024 | 2048 | 4096 |
| 144 | 288 | 576 | 1152 | 2304 | 4608 |
| 160 | 320 | 640 | 1280 | 2560 | 5120 |
| 176 | 352 | 704 | 1408 | 2816 | 5632 |
| 192 | 384 | 768 | 1536 | 3072 | 6144 |
| 208 | 416 | 832 | 1664 | 3328 | |
| 216 | 440 | 888 | 1776 | 3568 | |
| 240 | 480 | 960 | 1920 | 3840 | |

The underlying FEC coder 104 supports only a limited set of FEC block sizes (or input sizes). Without loss of generality, it is assumed that FEC coder 104 is a turbo coder, and the set of FEC block sizes supported by the turbo coder is the set of interleaver sizes for which the turbo code internal interleaver is defined. However, one of ordinary skill in the art will recognize that other FEC schemes may be used in 104, including low-density parity check (LDPC) codes, convolutional codes, block turbo codes, Reed-Solomon codes, etc.

Once the number of segments C and the FEC block size for each segment is determined, this information is passed to code block segmentation circuitry 102 where the CTB (X bits) is segmented into C segments which are encoded with FEC block size $K_I$, if only one FEC block size is allowed. Alternatively, if two adjacent FEC block sizes are allowed, the code block segmentation circuitry 102 may output $C_I$ segments which are to be encoded with FEC block size $K_I$ and $C_{I-1}$ segments which are to be encoded with FEC block size $K_{I-1}$.

Filler Bit Insertion

The number of filler bits (padded for each segment) may be determined based on the segment size and the FEC block size being used for FEC encoding of the segment. There are at least two ways to distribute the overall filler bits into the C segments.

Concentrated-filler. Put the filler bits into as few segments as possible without making the segment sizes too small. In one example, all filler bits may appear in the beginning of the first segment. The advantage is that only one segment (containing all the filler bits) needs to be handled separately. Moreover, the filler bits can be padded to the segment that is encoded with the larger FEC block size $K_I$ rather than smaller FEC block size $K_{I-1}$ when two FEC block sizes are used for a CTB. This method is particularly attractive when allowing two adjacent FEC block sizes for encoding.

Distributed-filler. Distribute the filler bits evenly (as much as possible) into a plural of segments. The filler bits can be distributed to as many as all C segments.

For efficient implementation of the transmitter and the receiver, concentrated-filler is preferred. A preferred embodiment is to append Y" (if allowing two adjacent FEC block sizes; Y if allowing one FEC block size only) consecutive filler bits to the front of the one of the segments (e.g., the first or the last) using FEC block size $K_I$ before sending it to the encoder. In terms of performance, it is equivalent to appending the Y" consecutive filler bits to the end of a segment having FEC block size $K_I$.

Returning to FIG. 1, for each segment (produced by circuitry 102), an FEC codeword is determined using the steps of inserting filler bits into the segment to form an FEC input block; FEC encoding the FEC input block; and discarding bits related to the filler bits.

Each segment produced by circuitry 102 is passed to filler circuitry 103 where filler bit insertion takes place. If no filler bits are required, then filler circuitry is transparent, i.e., no filler bits are added ($K_{filler}$=0). The segments (along with filler bits) are then passed to turbo encoder 104 where turbo encoding of the C segments leads to C FEC codewords. The filler bits are then discarded by circuitry 105 and the resulting C codewords are appropriately transmitted by transmission circuitry 108. If no filler bits are added by circuitry 103, then filler discard circuitry 105 is transparent, i.e., no filler bits are removed ($K_{filler}$=0). Note that it is possible that circuitry 105 may not discard any bits corresponding to the filler bits.

Figure 2:
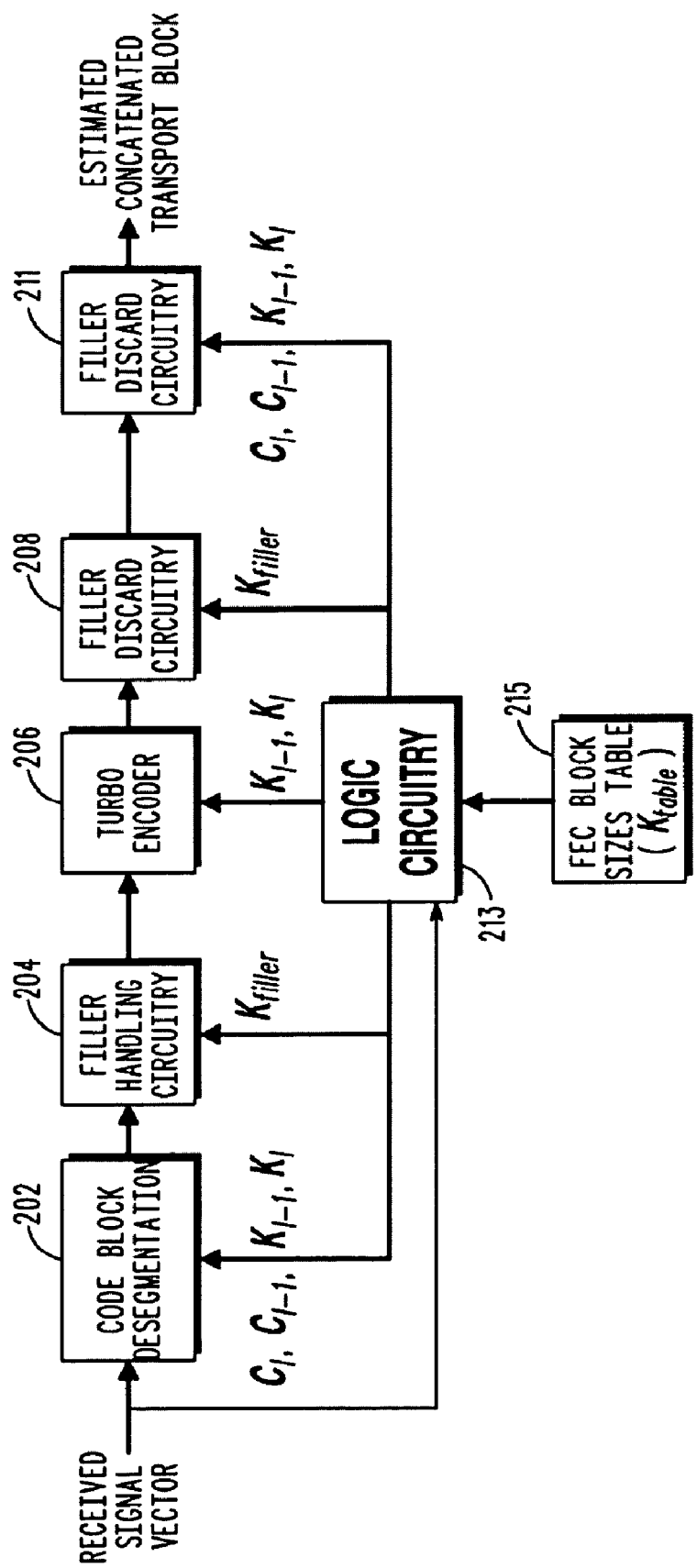
FIG. 2 is a block diagram of a receiver.

FIG. 2 is a block diagram of a receiver. During operation the received signal vector goes through the code block de-segmentation circuitry 202 which organizes portions of received signal vector according to the segment they are associated with. The segment size, number of segments, FEC block size used to turbo-decode each segment, number of filler bits may be determined using logic circuitry 213 and available FEC block size table 215 in a fashion similar to that at the encoder. The filler handling circuitry 204 uses the knowledge of the location of filler bits to benefit turbo decoder 206, for e.g., by setting the LLRs corresponding to filler bits to a high magnitude. After turbo decoding, circuitry 208 discards the filler bits to obtain estimate of a segment. The code block assembler 211 assembles the estimated transport by suitably collecting and arranging the estimates of the segments obtained from circuitry 208.

Removal of Parity Bits of Constituent Coder

This section provides a specific way of determining the FEC codeword. The method takes advantage of the knowledge of filler bits insertion at the transmitter is described. In particular, the method determines which bits (both systematic and parity bits) can be discarded from the turbo encoder output with no or negligible significant performance degradation. In general, the filler bits are known, and hence the systematic bits of these bits (equal to the known bits) can be discarded prior to transmission. However, it is not clear if any parity bits can be discarded.

Figure 3:
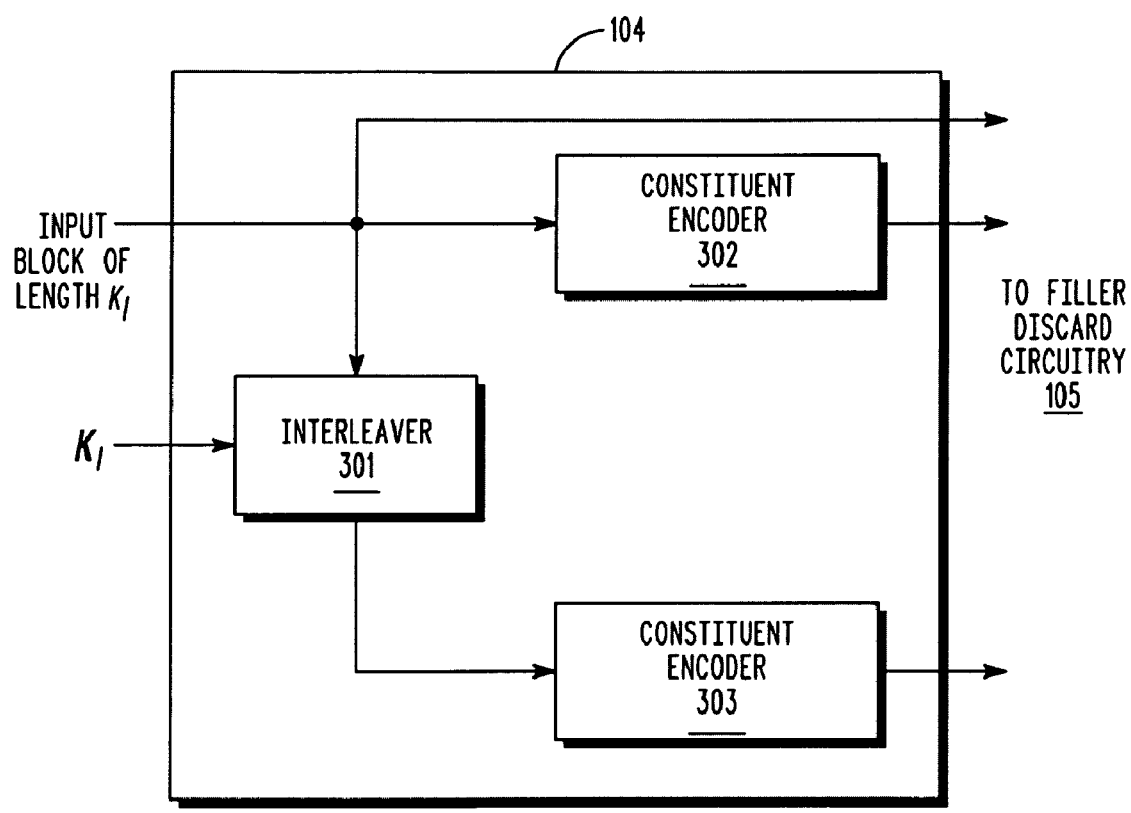
FIG. 3 is a block diagram of the turbo encoder of FIG. 1.

FIG. 3 is a block diagram of turbo encoder 104 of FIG. 1. During operation, input block of length $K_I$ bits enters both interleaver 301 and constituent encoder 302. Interleaver 301 interleaves the input block and passes the input block in interleaved order to constituent encoder 303. Constituent encoder 303 then encodes the interleaved input block. In a similar manner, constituent encoder 302 encodes the original input block. The codeword block x is composed of systematic block (equal to the FEC input block), output of constituent encoder 302, and output of constituent encoder 303. The codeword block x is then sent to circuitry 105.

In a conventional turbo encoder such as e.g., tailed turbo codes, the initial state of the constituent encoders (shift register contents) is assumed to be all-zero.

In such case, when $K_{filler}$ filler bits (usually 0's) are inserted at the beginning of the turbo code input block, the systematic bits and the parity bits of the constituent encoder 302 corresponding to the $K_{filler}$ bit positions are all zeros. Therefore, these bits may be discarded at the transmitter and the receiver can utilize this knowledge while performing turbo decoding. However, in the constituent encoder 303, the $K_{filler}$ bits are scrambled due to the turbo code interleaver and hence the parity bits of constituent encoder 303 corresponding to the filler bits are not known and thus cannot be discarded simply.

When the turbo coder has tail-biting constituent encoders, the initial state of the constituent encoders may not be always zero. For tail-biting codes, the initial state and the final state for a constituent encoder are equal and they depend on the input block. Therefore, when $K_{filler}$ consecutive filler bits (i.e., zeros) are inserted at the beginning of the turbo code input block, the parity bits of constituent encoder 302 corresponding to the $K_{filler}$ bit positions are not always zeros. However, it can be proven that most of these $K_{filler}$ parity bits of the constituent encoder 302 carry no information.

In general, groups of consecutive filler bits are inserted into a segment to form an FEC input block wherein the group length is a multiple of $2^m-1$ (=7 for the constituent convolutional codes within the 3GPP turbo coder). Then, the FEC input block is FEC encoded and parity bits related to the filler bits are discarded. The FEC encoder can be a tail-biting convolutional code used alone, or a tail-biting convolutional code used as a constituent code of a turbo coder.

In particular, when used for turbo codes with tail-biting constituent codes, groups of systematic bits corresponding to the filler bits may be discarded; and the parity bits corresponding to the groups of filler bits at the output of a constituent encoder may be discarded, wherein the constituent encoder takes the FEC input block without interleaving for tail-biting turbo coders. This can be shown as follows.

Let the state of the shift register of constituent encoder 302 at step i be S(i), let m be the number of elements in the shift register, and let g be any integer greater than 0. When $(2^m-1) \times g$ zeros are input to the constituent encoder from step i+1 to step $i+(2^m-1) \times g$, the following is a property of recursive convolutional encoder (such as the one used in Rel. 6 3GPP turbo code), $$S(i)=S(i+(2^m-1)g) \quad (7)$$

Note that S(i) may not be a constant. In addition, the states S(j) in between may not be a constant or equal to state S(i), $i<j<i+(2^m-1)g$.

Therefore, the state of the constituent encoder remains unchanged between step i+1 to step $i+(2^m-1) \times g$. Therefore, the transmitter can take advantage of (7) by discarding the constituent encoder output during those steps, as these filler bits do not change the shift register state and thus providing no information for the decoder. The decoder within the receiver can also take advantage of (7) similarly based on the knowledge of filler bit positions and values. Next, the above method is described with an example where $K_{filler}$ filler bits (zeros) are inserted in consecutive positions in the input of a tail-biting turbo code.

Since $K_{filler}$ consecutive filler bits (zeros) are inserted in the turbo code input block, $g=\lfloor K_{filler}/(2^m-1) \rfloor$, and therefore $p \times g \times (2^m-1)$ parity bits of constituent encoder 302 may be discarded, where p is the number parity bits at the output of the constituent encoder 302 that are generated for each bit in the FEC input block. Therefore, only the parity bits corresponding to the groups of filler bits at the output of constituent encoder 302 are discarded, wherein constituent encoder 302 takes the FEC input block without interleaving for tail-biting turbo coders.

For a tail-biting 3GPP turbo coder, p=1 in constituent encoder 1, m=3. Thus $7\lfloor K_{filler}/(2^m-1) \rfloor$ parity bits can be discarded from constituent encoder 302 for $K_{filler}$ consecutive filler bits. Since m=3, at most only 6 parity bits corresponding to the $K_{filler}$ filler bits of constituent encoder 302 may need to be kept at the output of constituent encoder 302.

In constituent encoder 303, the $K_{filler}$ filler bits may get dispersed due to the turbo code interleaver. Therefore, it may not be possible to discard the parity bits from the constituent encoder 303 without affecting performance.

The following section describes some example scenarios in which the code block segmentation rule may be used, e.g., hybrid-Automatic Repeat reQuest (HARQ), Multiple Input Multi Output (MIMO), etc.

Transport Block (TB) Former

Figure 4:
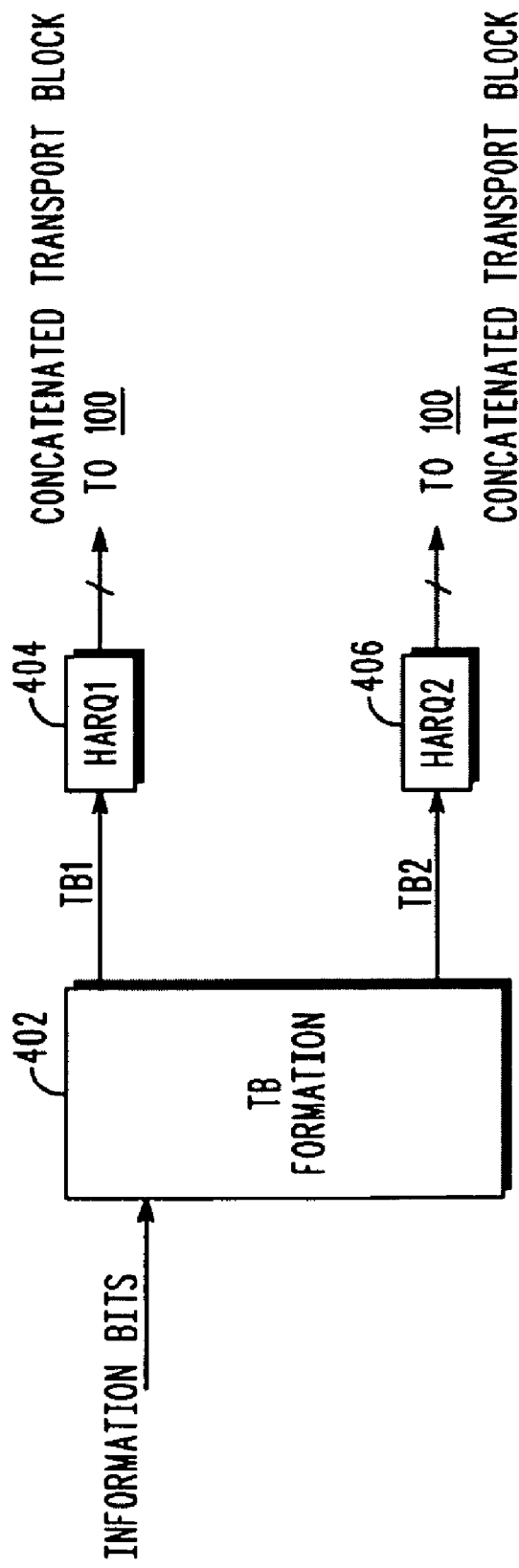
FIG. 4 is a block diagram of transport block former on the transmitter side.

The code block segmentation rule described above is applied to a concatenated transport block (CTB) on a hybrid ARQ (HARQ) channel. Before code block segmentation, the information bits than needs to be sent to a single user from the base station within a transmission time interval (TTI) may need to be divided into at least one transport block, thus going through at least one HARQ channel. For example FIG. 4 shows an example wherein the information bits are transmitted using two HARQ channels (corresponding to HARQ1, and HARQ2), and two transport blocks TB1 and TB2. During operation, information bits of length A are received by TB formation circuitry 402 to be transmitted on one or more spatial streams. Circuitry 402 designates X' bits as a transport block TB1, where $X' \leq A$; HARQ1 processor 404 attaches CRC bits to the X' bits to form the concatenated transport block of length X; the concatenated transport block of length X is mapped to a first HARQ channel. The concatenated transport block is sent to the code block segmentation circuitry 102.

Circuitry 402 designates W'=A-X' bits from the information bits as a second transport block TB2; HARQ2 processor 406 attaches CRC bits to Y bits form a second concatenated transport block; the concatenated transport block is mapped to a second HARQ channel. The concatenated transport block is sent to the code block segmentation circuitry 102.

Note that circuitry 404 and 406 may perform additional functions such as other functionalities related to HARQ, adding control information, etc.

Though the concepts in FIG. 4 are illustrated using two HARQ channels, they can be easily extended to a plurality of HARQ channels. If more than one HARQ channel is supported to a user within a Transmission Time Interval (TTI), the code block segmentation rule may be applied to each TB.

Multiple HARQ channels may occur due to having too many FEC codewords (or segments) per TTI per user, such as from large bandwidth (e.g., 20 MHz), higher order modulation (e.g., 64 QAM), multistream MIMO, etc. Multiple HARQ channels may also be used for TBs that have different QoS, such as VoIP and best-effort data.

A MIMO codeword comprises the bits that are sent to a single user within a TTI on one MIMO stream. Thus a MIMO codeword may comprise one or more FEC codewords. Sometimes a MIMO codeword is used to refer to the bits on a MIMO stream.

Rules may be defined for the creation of a TB. In one embodiment, a TB shall comprise no more than x (e.g., x=8) FEC codewords (value of x determined by the eNodeB scheduler in EUTRA). In another embodiment, if more than x FEC codewords are needed for a TB, then two TBs are created as follows. The packet is divided approximately evenly between two TBs, each TB having nearly the same number of FEC codewords of approximately the same size. In yet another embodiment, for FEC codewords that are to be sent to two MIMO streams, each belongs to a separate TB. In yet another embodiment, for FEC codewords that are to be sent to three MIMO streams while using 2 simultaneous HARQ channels, the first (on average, best quality stream) belongs to one TB and the second and third stream belong to a second TB. In yet another embodiment, four MIMO codewords to be sent using two HARQ channels, several combinations are possible. For example, (a) TB1=1,2 TB2=3,4 (b) TB1=1,3 TB2=2,4 (c) TB1=1,2 TB2=2,3 (d) TB1=1, TB2=2,3,4. Here TBi refers to TB of i-th HARQ channel; numbers 1 through 4 indicates the MIMO codeword (or stream) number.

Figure 5:
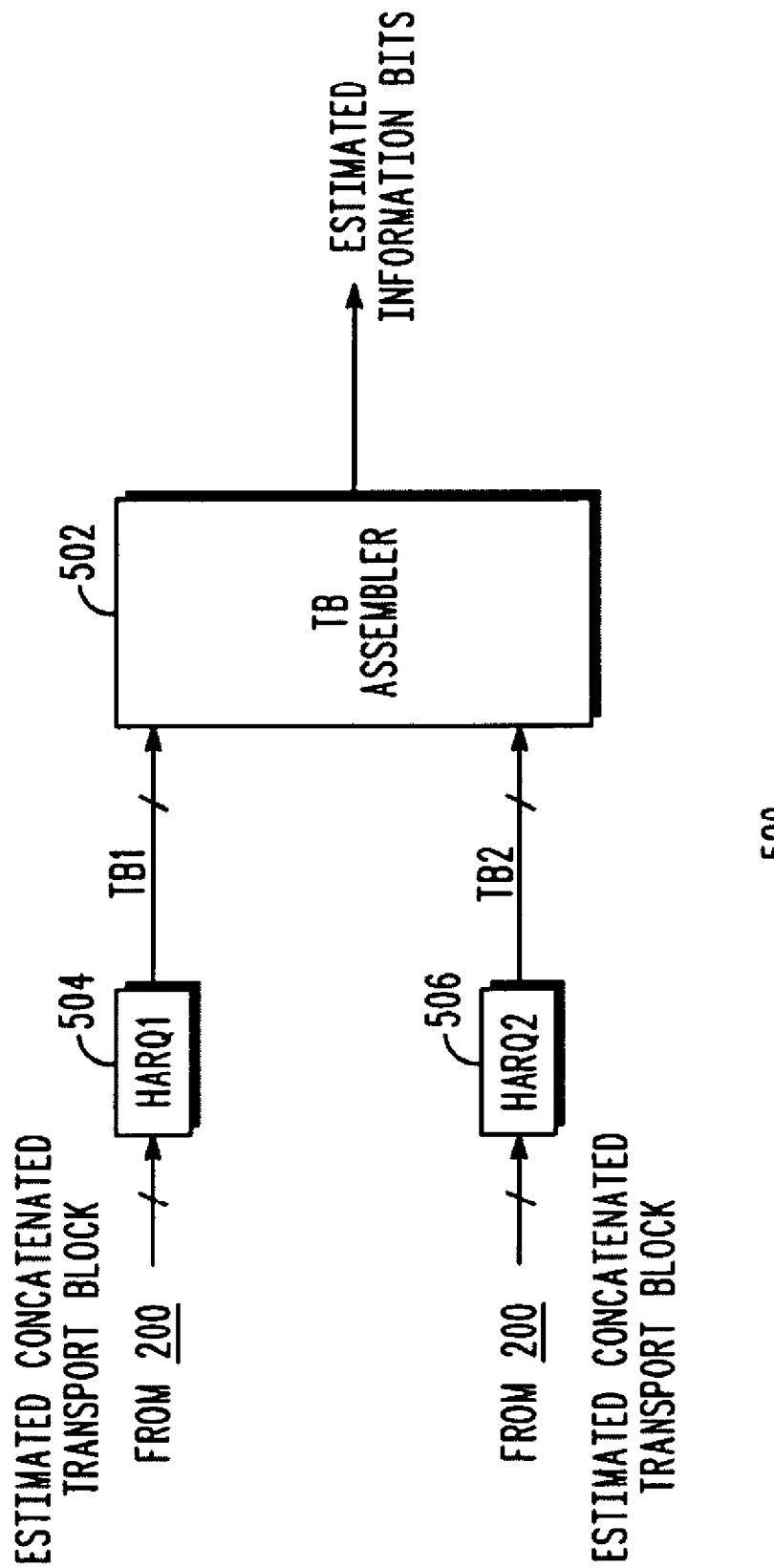
FIG. 5 is a block diagram of a transport block assembler on the receiver side.

FIG. 5 is a block diagram of receiver processing when information bits are received over at least one HARQ channel. The received bits from the code block assembler 211 are input to the appropriate channel processors 504 and 506. The output of the channel processors are the estimated transports blocks TB1 and TB2 which are input to the TB assembler circuitry 502 which combines the TBs and outputs estimated information bits.

Figure 6:
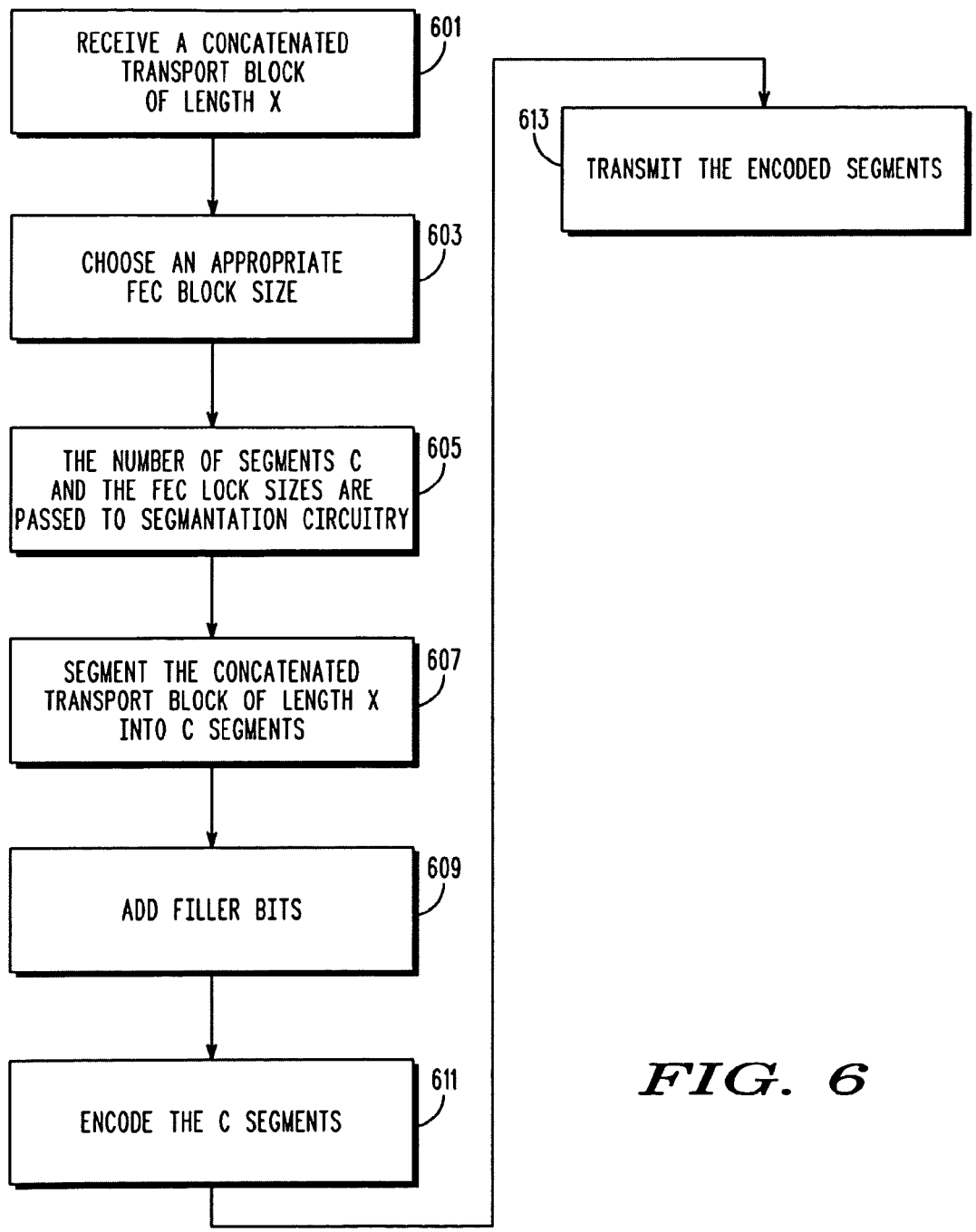
FIG. 6 is a flow chart showing operation of the transmitter of FIG. 1.

FIG. 6 is a flow chart showing operation of the transmitter of FIG. 1. The logic flow begins at step 601 where segmentation circuitry receives a concatenated transport block of length X. At step 603 logic circuitry accesses table 107 and chooses an appropriate FEC block size. As discussed above, in a first embodiment of the present invention the FEC block size $K_I$ is determined from a group of non-contiguous FEC block sizes located in table 107, where the available non-contiguous FEC block sizes in table 107 are between $K_{min}$ and $K_{max}$, and wherein $K_{min} \leq K_I < K_{max}$. As discussed above, $K_I$ is based on X. X is determined by logic circuitry 106 from the concatenated transport block. Once X is determined, $K_I = \lceil X/C \rceil + \delta$ and $C = \lceil X/K_{max} \rceil$ are determined. In a second embodiment of the present invention FEC block sizes $K_I$ and $K_{I-1}$ are determined, where $K_I = \lceil X/C \rceil + \delta$.

Continuing, at step 605 the number of segments C and the FEC lock sizes are passed to segmentation circuitry 102 and at step 607 segmentation circuitry segments the concatenated transport block of length X into C segments of size substantially equal to $K_I$ (or alternatively $K_I$ and $K_{I-1}$). Filler bits are added (if necessary) at step 609 via circuitry 103 and at step 611 each of the C segments are encoded (i.e., an FEC codeword is determined for each of the C segments). Finally, at step 613 the FEC codewords are transmitted via transmission circuitry 108.

As discussed above, the step of determining an FEC codeword comprises the steps of inserting filler bits into the segment to form an FEC input block, FEC encoding the FEC input block, and discarding bits related to the filler bits. This step may entail inserting groups of consecutive filler bits into a segment to form an FEC input block where the group length is a multiple of 7, FEC encoding the FEC input block, and discarding bits related to the filler bits. Discarding filler bits comprises the steps of discarding groups of systematic bits corresponding to the filler bits and discarding the parity bits corresponding to the groups of filler bits at the output of constituent encoder 1, where constituent encoder takes the FEC input block without interleaving for tail-biting turbo coders.

Figure 7:
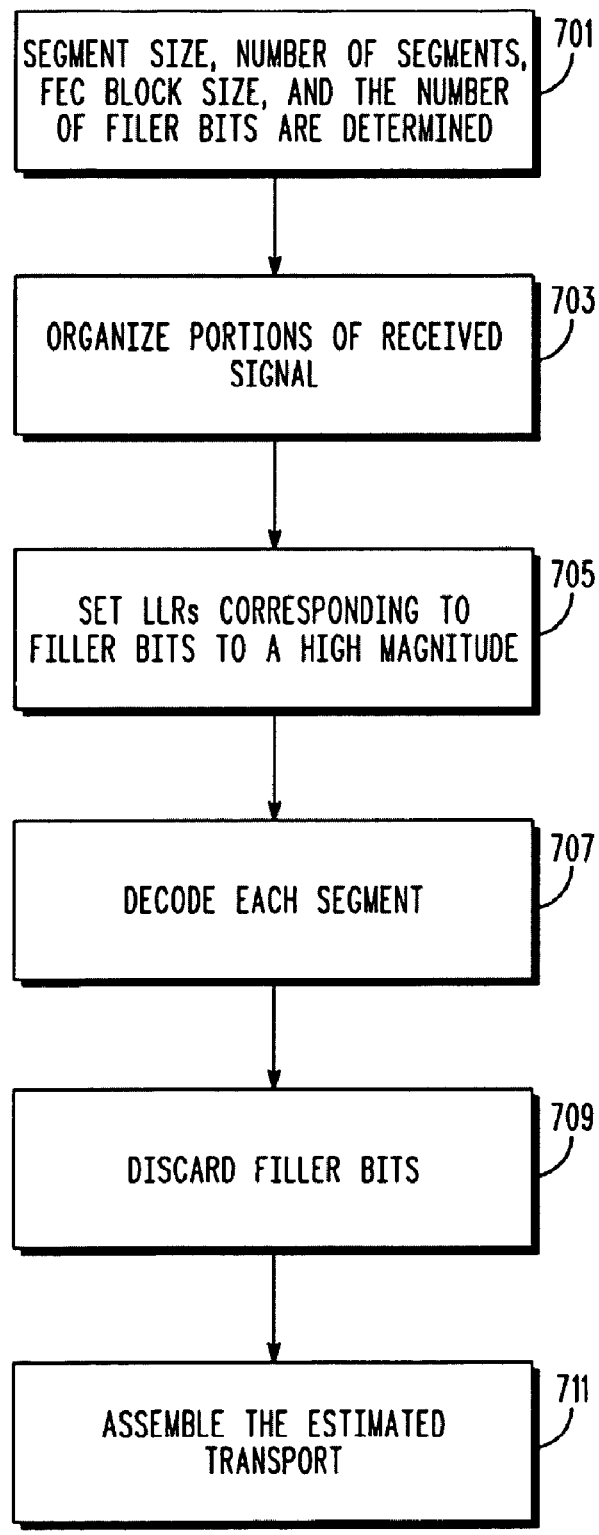
FIG. 7 is a flow chart showing operation of the receiver of FIG. 2.

FIG. 7 is a flow chart showing operation of the receiver of FIG. 2. The logic flow begins at step 701 where the segment size, number of segments, FEC block size used to turbo-decode each segment, and the number of filler bits are determined using logic circuitry 213 and table 215. As discussed above, in a first embodiment of the present invention the FEC block size $K_I$ is determined from a group of non-contiguous FEC block sizes located in table 215, where the available non-contiguous FEC block sizes in table 215 are between $K_{min}$ and $K_{max}$, and wherein $K_{min} \leq K_I < K_{max}$. As discussed above, $K_I$ is based on X. X is determined by logic circuitry 213 from the received signal vector. Logic circuitry 213 then determines $K_I = \lceil X/C \rceil + \delta$ and $C = \lceil X/K_{max} \rceil$. In a second embodiment of the present invention FEC block sizes $K_I$ and $K_{I-1}$ are determined, where $K_I = \lceil X/C \rceil + \delta$.

At step 703 a received signal vector goes through code block de-segmentation circuitry 202 which organizes portions of received signal vector according to the C segment they are associated with. At step 705 filler handling circuitry 204 uses the knowledge of the location of filler bits to benefit turbo decoder 206, for e.g., by setting the LLRs corresponding to filler bits to a high magnitude. Each of the C segments is decoded at step 707. After turbo decoding, circuitry 208 discards the filler bits to obtain estimate of a segment (step 709). Code block assembler 211 assembles the estimated transport by suitably collecting and arranging the estimates of the segments obtained from circuitry 208 (step 711).

While the invention has been particularly shown and described with reference to a particular embodiment, it will be understood by those skilled in the art that various changes in form and details may be made therein without departing from the spirit and scope of the invention. It is intended that such changes come within the scope of the following claims.

The invention claimed is:

1. A method of operating a transmitter, the method comprising the steps of:
   receiving a concatenated transport block of length X;
   determining an available FEC block size $K_I$ from a group of non-contiguous FEC block sizes, wherein the available non-contiguous FEC block sizes are between $K_{min}$ and $K_{max}$, and wherein $K_{min} <= K_I < K_{max}$, and wherein $K_I$ is additionally based on X;
   segmenting the concatenated transport block of length X into C segments of sizes substantially equal to $K_I$;
   determining an FEC codeword for each of the C segments using FEC block size $K_I$;
   transmitting the C FEC codewords over the channel;
   inserting groups of consecutive filler bits into a segment to form an FEC input block wherein the group length is a multiple of 7;
   FEC encoding the FEC input block; and
   discarding bits related to the filler bits.

2. The method of claim 1 wherein the method of discarding bits further comprises the steps of
 discarding groups of systematic bits corresponding to the filler bits; and
 discarding the parity bits corresponding to the groups of filler bits at the output of constituent encoder 1, wherein constituent encoder takes the FEC input block without interleaving for tail-biting turbo coders.

3. A method of operating a transmitter, the method comprising:
 receiving a concatenated transport block of length X;
 determining two available FEC block sizes $K_{I-1}$ and $K_I$ from a group of non-contiguous FEC block sizes, wherein the available non-contiguous FEC block sizes are between $K_{min}$ and $K_{max}$, and wherein $K_{min}<=K_{I-1}<K_{max}$, $K_{min}<=K_I<=K_{max}$, and wherein $K_{I-1}$ and $K_I$ are additionally based on X;
 segmenting the concatenated transport block of length X into C segments of sizes substantially equal to $K_{I-1}$ or $K_I$;
 determining an FEC codeword for each of the C segments using FEC block sizes $K_I$ or $K_{I-1}$; and
 transmitting the C FEC codewords over the channel;
 wherein $C=\lceil X/K_{max} \rceil = C_{I-1}+C_I$, where $$Y=CK_I-X,$$

$$C_{I-1}=\lfloor Y/D_I \rfloor,$$

$$C_I=C-\lfloor Y/D_I \rfloor,$$

and $C_{I-1}$ and $C_I$ are the number of segments that are encoded using FEC block sizes $K_{I-1}$ and $K_I$, respectively, where $K_I$ is the smallest size from available FEC block sizes that is greater than or equal to $\lceil X/C \rceil$ and $D_I$ denotes the difference between the adjacent interleaver sizes $K_{I-1}$ and $K_I$.

4. The method of claim 3 wherein the step of determining an FEC codeword further comprises the steps of
 inserting filler bits into the segment to form an FEC input block;
 FEC encoding the FEC input block; and
 discarding bits related to the filler bits.

5. The method of claim 3 further comprising the steps of:
 receiving information bits of length A to be transmitted on more than one spatial stream;
 designating X' bits as a transport block, $X' \leq A$;
 attaching CRC bits to form the concatenated transport block of length X; and
 wherein the concatenated transport block of length X is mapped to a first HARQ channel.

6. The method of claim 5 further comprising the steps of:
 designating W'=A−X' bits the information bits as a second transport block;
 attaching CRC bits to Y bits to form a second concatenated transport block;
 wherein the concatenated transport block is mapped to a second HARQ channel.

7. The method of claim 3 wherein the step of determining an FEC codeword further comprises the steps of
 inserting groups of consecutive filler bits into a segment to form an FEC input block wherein the group length is a multiple of 7;
 FEC encoding the FEC input block; and
 discarding bits related to the filler bits.

8. The method of claim 7 wherein the method of discarding bits further comprises the step of
 discarding groups of systematic bits corresponding to the filler bits; and
 discarding the parity bits corresponding to the groups of filler bits at the output of constituent encoder 1, wherein constituent encoder takes the FEC input block without interleaving for tail-biting turbo coders.

9. An apparatus comprising:
 receiving circuitry receiving a concatenated transport block of length X;
 logic circuitry determining two available FEC block sizes $K_{I-1}$ and $K_I$ from a group of non-contiguous FEC block sizes, wherein the available non-contiguous FEC block sizes are between $K_{min}$ and $K_{max}$, and wherein $K_{min}<=K_{I-1}<K_{max}$, $K_{min}<=K_I<=K_{max}$, and wherein $K_{I-1}$ and $K_I$ are additionally based on X;
 code block segmentation circuitry segmenting the concatenated transport block of length X into C segments of sizes substantially equal to $K_{I-1}$ or $K_I$;
 encoding circuitry determining an FEC codeword for each of the C segments using FEC block sizes $K_I$ or $K_{I-1}$; and
 transmission circuitry transmitting the C FEC codewords over the channel
 wherein $C=\lceil X/K_{max} \rceil = C_{I-1}+C_I$, where $$Y=CK_I-X,$$

$$C_{I-1}=\lfloor Y/D_I \rfloor,$$

$$C_I=C-\lfloor Y/D_I \rfloor,$$

and $C_{I-1}$ and $C_I$ are the number of segments that are encoded using FEC block sizes $K_{I-1}$ and $K_I$, respectively, where $K_I$ is the smallest size from available FEC block sizes that is greater than or equal to $\lceil X/C \rceil$ and $D_I$ denotes the difference between the adjacent interleaver sizes $K_{I-1}$ and $K_I$.

10. The apparatus of claim 9 wherein $C=\lceil X/K_{max} \rceil$.

11. The apparatus of claim 9 further comprising:
 filler circuitry inserting filler bits into at least one segment to form an FEC input block.

* * * * *